(12) United States Patent
Hiroshima et al.

(10) Patent No.: US 9,905,452 B2
(45) Date of Patent: Feb. 27, 2018

(54) METHOD OF FORMING MASK PATTERN, METHOD OF PROCESSING SUBSTRATE, AND METHOD OF FABRICATING ELEMENT CHIPS

(71) Applicant: Panasonic Intellectual Property Management Co., Ltd., Osaka (JP)

(72) Inventors: Mitsuru Hiroshima, Osaka (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/252,899

(22) Filed: Aug. 31, 2016

(65) Prior Publication Data

US 2017/0069522 A1 Mar. 9, 2017

(30) Foreign Application Priority Data

Sep. 3, 2015 (JP) ................................. 2015-173729

(51) Int. Cl.
 *H01L 21/683* (2006.01)
 *H01L 21/304* (2006.01)
 *H01L 21/78* (2006.01)

(52) U.S. Cl.
 CPC ........ *H01L 21/6836* (2013.01); *H01L 21/304* (2013.01); *H01L 21/6835* (2013.01); *H01L 21/78* (2013.01); *H01L 2221/6834* (2013.01); *H01L 2221/68318* (2013.01); *H01L 2221/68327* (2013.01)

(58) Field of Classification Search
 CPC ........... H01L 2221/67; H01L 2221/683; H01L 2221/68304; H01L 2221/68318; H01L 2221/68327; H01L 2221/6834; H01L 2221/6835; H01L 21/78–21/86; H01L 21/304–21/3043; B81C 1/00865–1/00904
 See application file for complete search history.

(56) References Cited

U.S. PATENT DOCUMENTS

| 2004/0087059 A1* | 5/2004 | Ruby ..................... H01L 21/50 438/113 |
| 2007/0045793 A1* | 3/2007 | Tanaka ................ H01L 21/6835 257/678 |

(Continued)

FOREIGN PATENT DOCUMENTS

JP 5591181 B2 9/2014

*Primary Examiner* — Michael Carter
*Assistant Examiner* — Mohammed R Alam
(74) *Attorney, Agent, or Firm* — Pearne & Gordon LLP

(57) ABSTRACT

In a method of fabricating element chips, a method of forming a mask pattern, and a method of processing a substrate, a process sequence is set such that developing in which the exposure-ended protection film is patterned is performed, after grinding in which the substrate is thinned by grinding a second surface opposite to a first surface to which a photosensitive protection film is pasted. Thereby, it is possible to perform the grinding for thinning in a state where the protection film is stable without being patterned, and to prevent the substrate or the protection film on which a mask pattern of the substrate is formed from being damaged at the time of the grinding, even in a case where a thin substrate of a wafer shape becomes a target.

10 Claims, 12 Drawing Sheets

(56) References Cited

U.S. PATENT DOCUMENTS

| | | | |
|---|---|---|---|
| 2010/0048001 A1* | 2/2010 | Harikai | H01J 37/32743 438/464 |
| 2012/0003816 A1* | 1/2012 | Shimotani | H01L 21/78 438/462 |
| 2014/0144585 A1* | 5/2014 | Singh | H01L 21/78 156/345.48 |
| 2014/0295644 A1 | 10/2014 | Harikai | |
| 2017/0062278 A1* | 3/2017 | Priewasser | H01L 21/568 |

* cited by examiner

METHOD OF FORMING MASK PATTERN, METHOD OF PROCESSING SUBSTRATE, AND METHOD OF FABRICATING ELEMENT CHIPS

BACKGROUND

1. Technical Field

The present disclosure relates to a method of forming a mask pattern, a method of processing a substrate, and a method of fabricating element chips which fabricates element chips by dicing the substrate by etching.

2. Description of the Related Art

Element chips such as semiconductor elements are fabricated by dividing a substrate of a wafer shape including a plurality of semiconductor elements partitioned into divided regions, for each diced semiconductor element (refer to, for example, PTL 1). In the related art described in PTL 1, first plasma dicing is first performed in which a mask of a resist film which covers semiconductor elements formed on a first surface and uncovers divided regions is formed and thereafter a protection film existing in the divided regions is removed, and furthermore, thereafter a substrate is thinned by mechanically grinding a surface opposite to the first surface after a protection tape is pasted to the first surface. Furthermore, thereafter, second plasma dicing is performed in which each semiconductor element of the substrate is divided by removing the divided regions uncovered from the mask.

CITATION LIST

Patent Literature

PTL 1: Japanese Patent No. 5591181

SUMMARY

However, in the related art including the aforementioned patent document example, the following failure can be generated in relation to mask formation and performance timing of mechanical grinding of an opposite surface. That is, in a case where the mechanical grinding of the opposite surface is performed after the mask formation is completed in the same manner as the aforementioned patent document example, the mechanical grinding is performed on the first surface of the substrate in a state where roughness is formed by a mask pattern, and thus, there is a possibility that the mask pattern is deformed due to force applied during mechanical grinding, or the mask pattern is damaged when a protection tape is peeled off.

In order to prevent the failure, it is considered to reversely set the performance timing of the mask formation and the mechanical grinding of the opposite surface. However, in this case, mask formation is performed by using a substrate thinned by the mechanical grinding as a target, and thus, a thin substrate of a wafer shape with a thickness of approximately several hunched micrometers to several dozen micrometers is handled. Accordingly, there is a possibility that damage such as cracking occurs in the substrate. In this way, in the related art, it is necessary to prevent a substrate or a mask pattern of the substrate from being damaged in a method of forming a mask pattern, a method of processing a substrate, and a method of fabricating element chips, in a case where a thin substrate of a wafer shape is used as a target, so as to fabricate element chips by dicing the substrate by etching.

Hence, an object of the present disclosure is to provide a method of forming a mask pattern, a method of processing a substrate, and a method of fabricating element chips which can prevent a substrate or a mask pattern of the substrate from being damaged, in a case where a thin substrate of a wafer shape is used as a target.

A method of forming a mask pattern in a substrate according to the present disclosure includes preparing a substrate having a first surface on which a photosensitive protection film is formed and a second surface opposite to the first surface, and exposing at least a part of the protection film. In addition, the method includes pasting a protection sheet to the protection film of the first surface after the exposing, grinding the second surface to thin the substrate after the pasting, and peeling the protection sheet to uncover the protection film of the first surface after the grinding. In addition, the method includes patterning the protection film by making the protection film come into contact with a developing solution which selectively dissolves any one of an exposed protection film and an unexposed protection film after the peeling.

A method of forming a mask pattern in a substrate according to the present disclosure includes preparing a substrate having a first surface on which a photosensitive protection film is formed and a second surface opposite to the first surface, and pasting a protection sheet to the protection film of the first surface after the preparing. In addition, the method includes exposing at least a part of the protection film by transmitting light through the protection sheet after the pasting, and grinding the second surface to thin the substrate. In addition, the method includes peeling the protection sheet to uncover the protection film of the first surface after the grinding, and patterning the protection film by making the protection film come into contact with a developing solution which selectively dissolves any one of an exposed protection film and an unexposed protection film, after the peeling.

A method of processing a substrate by etching according to the present disclosure includes preparing a substrate having a first surface on which a photosensitive protection film is formed and a second surface opposite to the first surface, and exposing at least a part of the protection film. In addition, the method includes pasting a protection sheet to the protection film of the first surface after the exposing, grinding the second surface to thin the substrate after the pasting, and peeling the protection sheet to uncover the protection film of the first surface after the grinding. In addition, the method includes patterning the protection film by making the protection film come into contact with a developing solution which selectively dissolves any one of an exposed protection film and an unexposed protection film after the peeling. In addition, the method includes etching the substrate by using the patterned protection film as a mask.

A method of processing a substrate by etching according to the present disclosure includes preparing a substrate having a first surface on which a photosensitive protection film is formed and a second surface opposite to the first surface, and pasting a protection sheet to the protection film of the first surface after the preparing. In addition, the method includes exposing at least a part of the protection film by transmitting light through the protection sheet after the pasting, grinding the second surface to thin the substrate, and peeling the protection sheet to uncover the protection film of the first surface after the grinding. In addition, the method includes patterning the protection film by making the protection film come into contact with a developing solution which selectively dissolves any one of an exposed protection film and an unexposed protection film, after the peeling. In addition, the method includes etching the substrate by using the patterned protection film as a mask.

A method of fabricating element chips by dicing a substrate by etching, according to the present disclosure, includes preparing a substrate having a first surface on which a photosensitive protection film is formed and a second surface opposite to the first surface, and exposing at least a part of the protection film. In addition, the method includes pasting a protection sheet to the protection film of the first surface after the exposing, grinding the second surface to thin the substrate after the pasting, and peeling the protection sheet to uncover the protection film of the first surface after the grinding. In addition, the method includes patterning the protection film by making the protection film come into contact with a developing solution which selectively dissolves any one of an exposed protection film and an unexposed protection film after the peeling. In addition, the method includes dicing the substrate into a plurality of element chips by etching the substrate, using the patterned protection film as a mask.

A method of fabricating element chips by dicing a substrate by etching, according to the present disclosure, includes preparing a substrate having a first surface on which a photosensitive protection film is formed and a second surface opposite to the first surface, and pasting a protection sheet to the protection film of the first surface after the preparing. In addition, the method includes exposing at least a part of the protection film by transmitting light through the protection sheet after the pasting, grinding the second surface to thin the substrate, and peeling the protection sheet to uncover the protection film of the first surface after the grinding. In addition, the method includes patterning the protection film by making the protection film come into contact with a developing solution which selectively dissolves any one of an exposed protection film and an unexposed protection film after the peeling. In addition, the method includes dicing the substrate into a plurality of element chips by etching the substrate, using the patterned protection film as a mask.

According to the present disclosure, even in a case where a substrate of a thin wafer shape becomes a target, it is possible to prevent the substrate or a mask pattern of the substrate from being damaged.

DETAILED DESCRIPTION

First Example

Figure 1A:
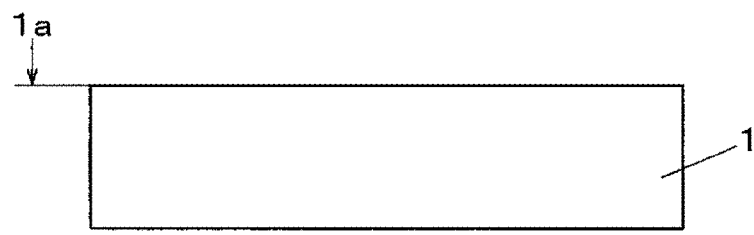
FIG. 1A is a process explanatory view illustrating a first example of a method of fabricating element chips according to an embodiment of the present disclosure.
Figure 1B:
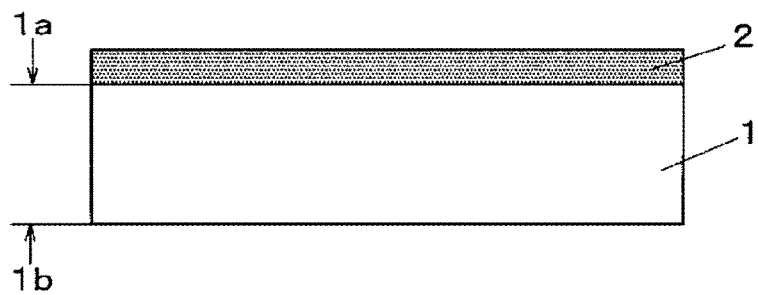
FIG. 1B is a process explanatory view illustrating the first example of the method of fabricating the element chips according to the embodiment of the present disclosure.
Figure 1C:
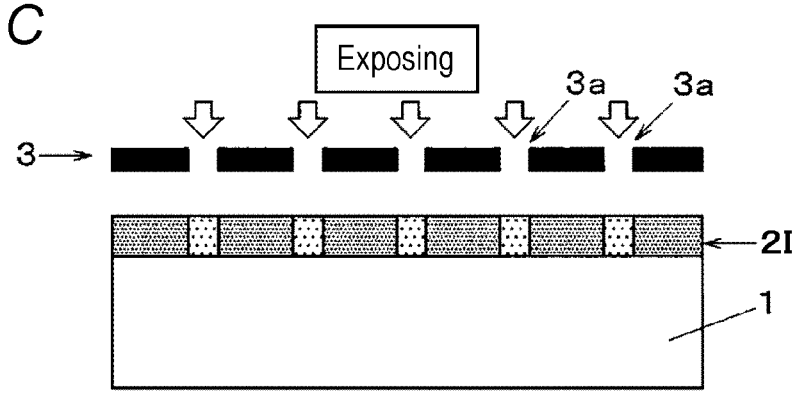
FIG. 1C is a process explanatory view illustrating the first example of the method of fabricating the element chips according to the embodiment of the present disclosure.

An embodiment of the present disclosure will be described with reference to the accompanying drawings. A first example of a method of fabricating element chips according to the present embodiment will be first described with reference to FIG. 1A to FIG. 3C. In FIGS. 1A to 1C, substrate 1 illustrated in FIG. 1A has a wafer shape having first surface 1a on which a plurality of element chips (refer to element chips 10 illustrated in FIG. 3C) are formed. As illustrated in FIG. 1B, photosensitive protection film 2 is formed on first surface 1a of substrate 1 by applying a resist. Thereby, substrate 1 having first surface 1a on which photosensitive protection film 2 is formed is prepared (preparing process). Second surface 1b opposite to first surface 1a is a grinding surface which is a grinding target in a post-process. Photosensitive protection film 2 may be formed on first surface 1a of substrate 1 by pasting a dry film resist formed by thinning a photosensitive material in a film shape, on first surface 1a of substrate 1, instead of coating the first surface with a resist.

Figure 1D:
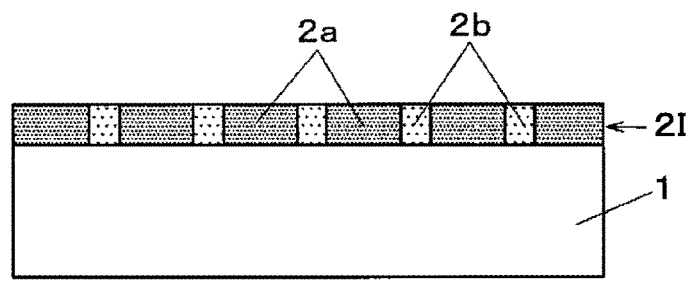
FIG. 1D is a process explanatory view illustrating the first example of the method of fabricating the element chips according to the embodiment of the present disclosure.

Subsequently, substrate 1 is moved to an exposing process, and photomask 3 in which openings 3a are formed in a predetermined pattern is set over an upper surface of protection film 2, as illustrated in FIG. 1C. In this state, photomask 3 is irradiated with light with a predetermined wavelength, and thereby only regions of protection film 2 corresponding to openings 3a of photomask 3 are exposed. That is, at least a part of protection film 2 is exposed in the exposing process. Thereby, exposure-ended protection film 2I is formed in which exposed protection film 2b and unexposed protection film 2a are distributed in correspondence with the pattern of openings 3a of photomask 3, as illustrated in FIG. 1D. In subsequent descriptions, "protection film 2I" indicates protection film 2 whose exposure ended through the exposing process. General exposure means, such as contact exposure, projection exposure of equal magnification, reduction projection type exposure which uses a stepper, or direct drawing which uses a laser or an electronic beam can be used as exposure means used in the exposing process.

Figure 2A:
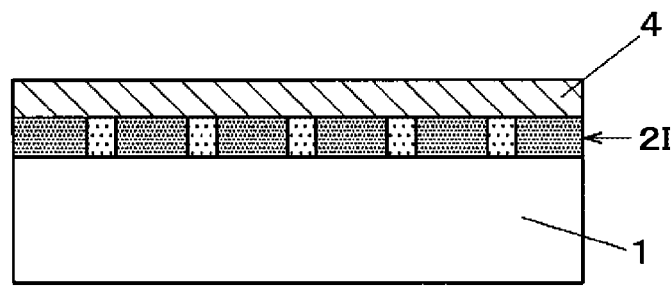
FIG. 2A is a process explanatory view illustrating the first example of the method of fabricating the element chips according to the embodiment of the present disclosure.
Figure 2B:
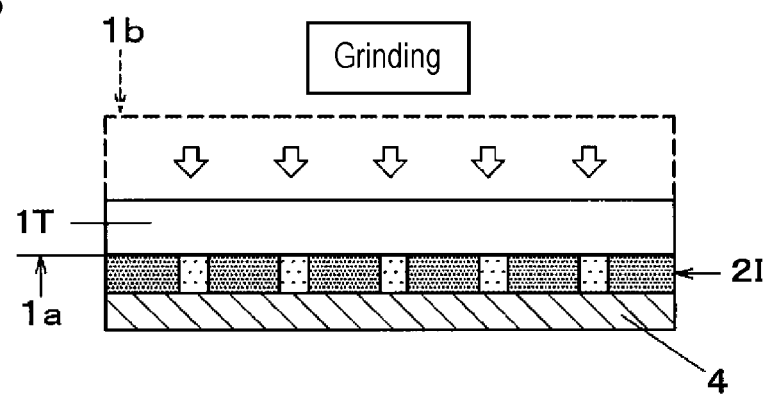
FIG. 2B is a process explanatory view illustrating the first example of the method of fabricating the element chips according to the embodiment of the present disclosure.

Subsequently, protection sheet 4 is pasted to protection film 2I of first surface 1a of substrate 1 (pasting process), as illustrated in FIG. 2A after the exposing process. Here, protection sheet 4 functions to protect substrate 1 on which protection film 2I is formed, when grinding is performed to mechanically thin substrate 1. In the pasting process, second surface 1b opposite to first surface 1a is mechanically ground, and thereby substrate 1 becomes substrate 1T thinned to have a predetermined thickness (grinding process), as illustrated in FIG. 2B. In subsequent descriptions, "substrate 1T" indicates substrate 1 thinned by grinding. Thereby, substrate 1T enters a state where protection sheet 4 is further pasted to a lower surface of protection film 2I formed on first surface 1a.

Figure 2C:
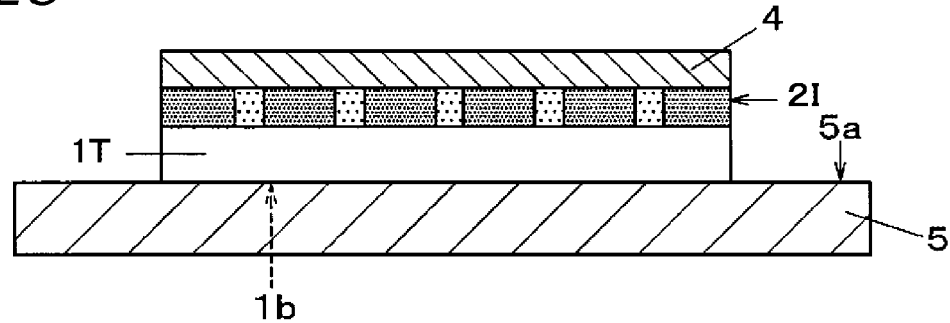
FIG. 2C is a process explanatory view illustrating the first example of the method of fabricating the element chips according to the embodiment of the present disclosure.
Figure 3A:
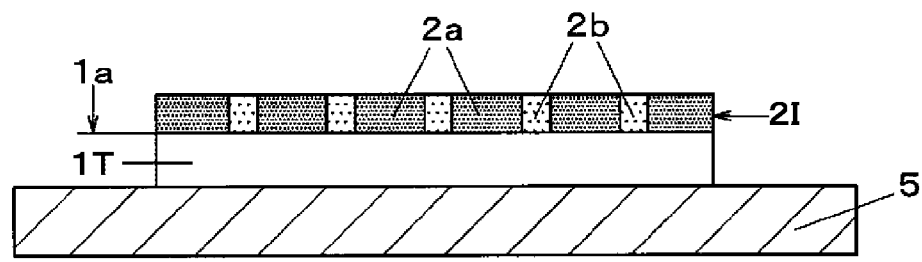
FIG. 3A is a process explanatory view illustrating the first example of the method of fabricating the element chips according to the embodiment of the present disclosure.

Thereafter, second surface 1b side of substrate 1T in the aforementioned state is supported by support surface 5a of carrier 5 with adhesiveness, as illustrated in FIG. 2C. In the aforementioned state, protection sheet 4 is peeled off from protection film 2I, as illustrated in FIG. 3A, and protection film 2I of first surface 1a is uncovered (peeling process). Thereby, exposed protection film 2b and unexposed protection film 2a are uncovered on an upper surface of protection film 2I. A dicing tape supported by a dicing frame, or a support substrate having an adhesive layer on support surface 5a can be exemplified as carrier 5.

In addition, a carrier of an electrostatic chucking type may be used as carrier 5. In a case of the carrier of an electrostatic chucking type, chucking force based on electrostatic force between substrate 1 and the carrier is generated by applying a voltage to an electrode embedded in the carrier, and thus, even though a support surface does not have adhesiveness, substrate 1 can be supported on the support surface. Since the carrier of an electrostatic chucking type can maintain chucking force even at a high temperature, the carrier can support substrate 1, even if thermal processing is performed with respect to substrate 1 supported by the carrier at a relatively high temperature at which, for example, an adhesive with resin properties is deteriorated.

Figure 3B:
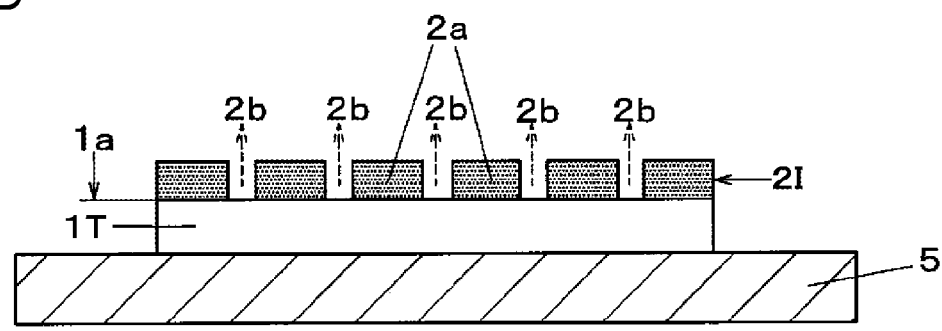
FIG. 3B is a process explanatory view illustrating the first example of the method of fabricating the element chips according to the embodiment of the present disclosure.

Subsequently, carrier 5 supporting substrate 1T on which protection film 2I is formed is moved to a developing process. Here, after the peeling process, protection film 2I comes into contact with a development solution selectively dissolving any one of exposed protection film 2b and unexposed protection film 2a, and thereby protection film 2I is patterned (developing process). Thereby, exposed protection film 2b is dissolved by the development solution and removed, only unexposed protection film 2a remains on first surface 1a of substrate 1T, and thereby the same pattern as photomask 3 is formed, as illustrated in FIG. 3B. It is preferable that thermal processing is performed for patterned substrate 1T before substrate 1T is moved to an etching process and thereby plasma resistance of protection film 2a increases.

Figure 3C:
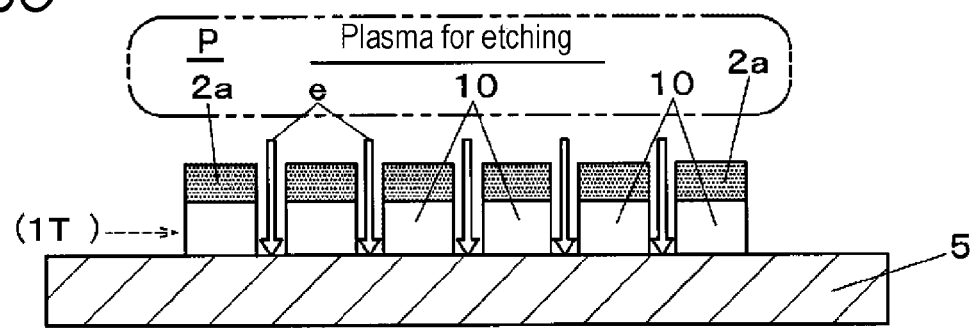
FIG. 3C is a process explanatory view illustrating the first example of the method of fabricating the element chips according to the embodiment of the present disclosure.

Subsequently, carrier 5 supporting patterned substrate 1T is moved to an etching process. Here, an example in which plasma etching performed by plasma processing is used as an etching method is illustrated. That is, carrier 5 supporting substrate 1T is mounted in a plasma etching device (not illustrated), the device generates plasma P for etching, and thereby, the region in which protection film 2a does not remain in substrate 1T is removed by a plasma etching action (arrow e), as illustrated in FIG. 3C. That is, substrate 1T is etched by using patterned unexposed protection film 2a as a mask (etching process). Substrate 1T is divided by the etching, and thereby substrate 1T is diced into a plurality of element chips 10 (dicing process). There is a case where protection film 2a used as a mask remains on a surface of diced element chips 10. In this case, remaining protection film 2a may be removed by ashing which uses plasma.

Figure 4:
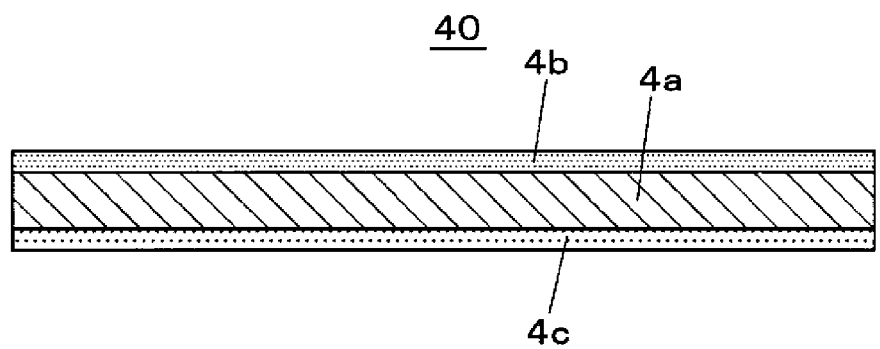
FIG. 4 is a sectional view of a protection sheet used in the method of fabricating the element chips according to the embodiment of the present disclosure.
Figure 5A:
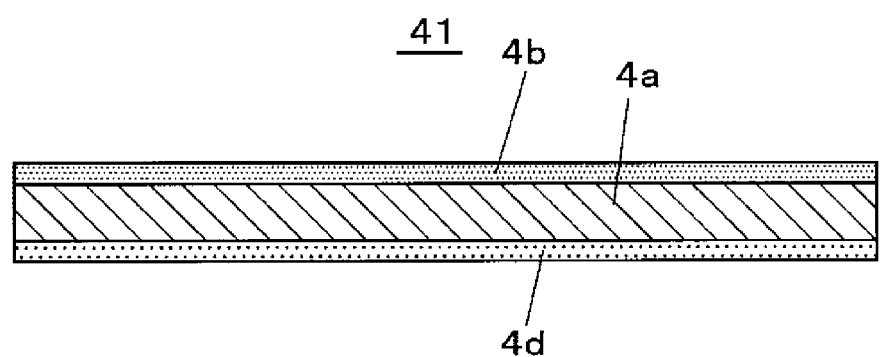
FIG. 5A is a sectional view of the protection sheet used in the method of fabricating the element chips according to the embodiment of the present disclosure.
Figure 5B:
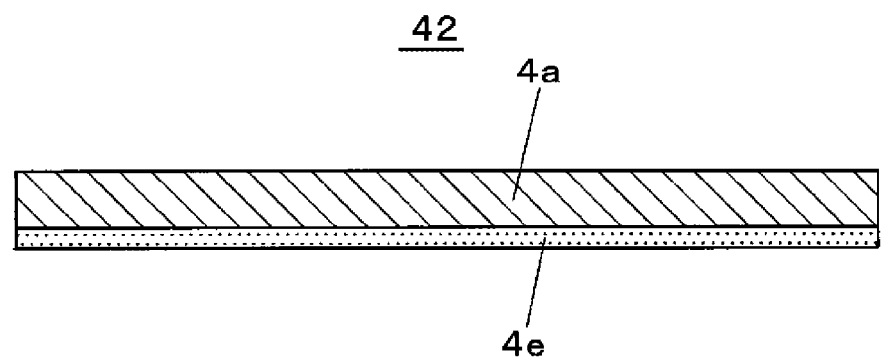
FIG. 5B is a sectional view of the protection sheet used in the method of fabricating the element chips according to the embodiment of the present disclosure.

Here, variation of protection sheet 4 used in the aforementioned method of fabricating the element chips will be described with reference to FIG. 4, FIG. 5A, and FIG. 5B. To begin with, protection sheet 40 illustrated in FIG. 4 has a configuration in which transmission preventing layer 4b formed of a metal such as aluminum is formed on an upper surface of base material 4a which is formed of a resin and has adhesive layer 4c on a lower surface of the base material. Transmission preventing layer 4b functions as a transmission preventing layer which prevents transmission of light which exposes protection film 2I. Thereby, even though the grinding process is performed in a place other than a yellow room (an optical lithography room illuminated with yellow light), protection film 2I is not additionally exposed to light, and thus, it is possible to prevent adverse effects on the patterning due to additional exposure.

Subsequently, protection sheet 41 illustrated in FIG. 5A has thermal peeling properties by providing adhesive layer 4d with thermal peeling properties as adhesive layer 4c included on the lower surface of base material 4a in protection sheet 40 illustrated in FIG. 4. In this case, in the peeling process illustrated in FIG. 3A, substrate 1T is heated, and thereby adhesive force of adhesive layer 4d of protection sheet 41 decreases. Accordingly, protection sheet 41 can be easily peeled. In addition, protection sheet 42 illustrated in FIG. 5B includes photo-curable adhesive layer 4e on a lower surface of base material 4a. A use aspect of protection sheet 42 will be described in a third example.

Figure 6A:
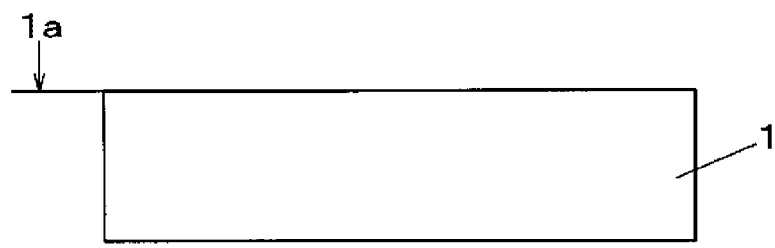
FIG. 6A is a process explanatory view illustrating a second example of the method of fabricating the element chips according to the embodiment of the present disclosure.
Figure 6B:
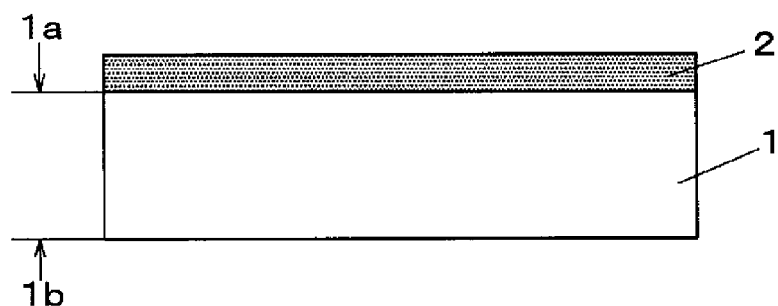
FIG. 6B is a process explanatory view illustrating the second example of the method of fabricating the element chips according to the embodiment of the present disclosure.
Figure 6C:
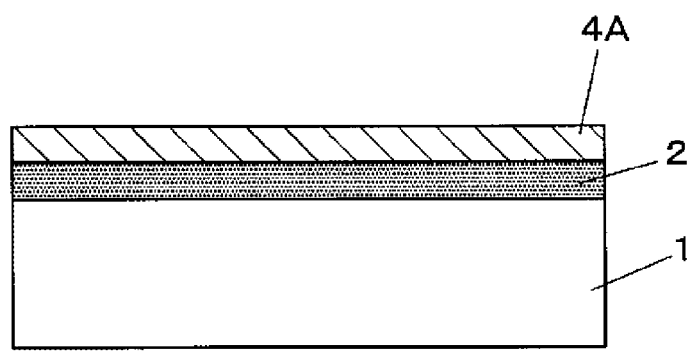
FIG. 6C is a process explanatory view illustrating the second example of the method of fabricating the element chips according to the embodiment of the present disclosure.

Subsequently, a second example of a method of forming element chips according to the present embodiment will be described with reference to FIG. 6A to FIG. 8C. The second example illustrates an example in which light-transmissive protection sheet 4A which transmits light is used as protection sheet 4. In FIGS. 6A to 6C, substrate 1 illustrated in FIG. 6A has a wafer shape having first surface 1a on which a plurality of element chips (refer to element chips 10 illustrated in FIG. 8C) are formed. As illustrated in FIG. 6B, photosensitive protection film 2 is formed on first surface 1a of substrate 1 by applying a resist. Thereby, substrate 1 having first surface 1a on which photosensitive protection film 2 is formed is prepared (preparing process). Second surface 1b opposite to first surface 1a is a grinding surface which is a grinding target in a post-process. Photosensitive protection film 2 may be formed on first surface 1a of substrate 1 by pasting a dry film resist formed by thinning a photosensitive material in a film shape, on first surface 1a of substrate 1, instead of coating the first surface with a resist.

Subsequently, substrate 1 is moved to a pasting process, and light-transmissive protection sheet 4A is pasted to protection film 2 of first surface 1a of substrate 1 (pasting process), as illustrated in FIG. 6C. Here, protection sheet 4A has a function of protecting substrate 1 on which protection film 2 is formed when grinding is performed to mechanically thin substrate 1, in the same manner as protection sheet 4 of the first example.

Figure 7A:
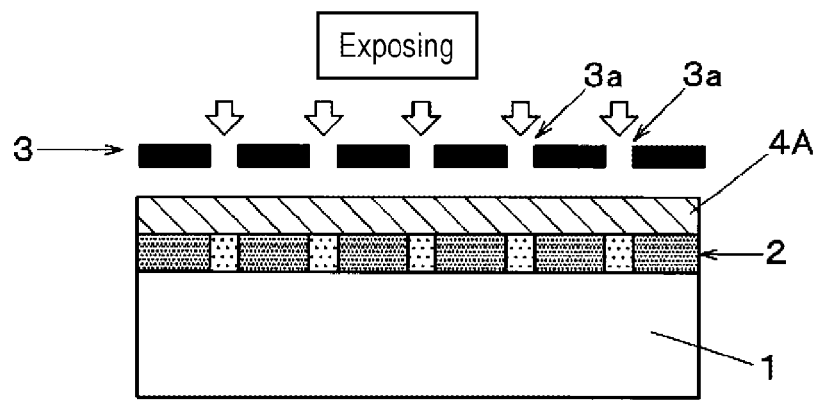
FIG. 7A is a process explanatory view illustrating the second example of the method of fabricating the element chips according to the embodiment of the present disclosure.
Figure 7B:
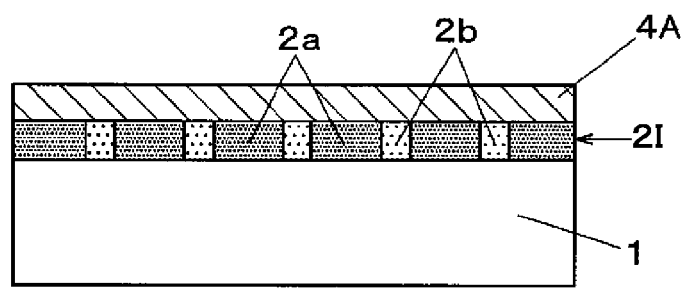
FIG. 7B is a process explanatory view illustrating the second example of the method of fabricating the element chips according to the embodiment of the present disclosure.

After the pasting process, substrate 1 is moved to an exposing process, and photomask 3 in which openings 3a are formed in a predetermined pattern is set over an upper surface of protection film 4A, as illustrated in FIG. 7A. In this state, photomask 3 is irradiated with light with a predetermined wavelength, and thereby only regions of protection film 2 corresponding to openings 3a of photomask 3 are exposed to light transmitting through protection sheet 4A. That is, at least a part of protection film 2 is exposed in the exposing process. Thereby, exposure-ended protection film 2I is formed in which exposed protection film 2b and unexposed protection film 2a are distributed in correspondence with the pattern of openings 3a of photomask 3, as illustrated in FIG. 7B. Exposure means, such as contact exposure, projection exposure of equal magnification, reduction projection type exposure which uses a stepper, or direct drawing which uses a laser can be used as exposure means used in the exposing process.

Figure 7C:
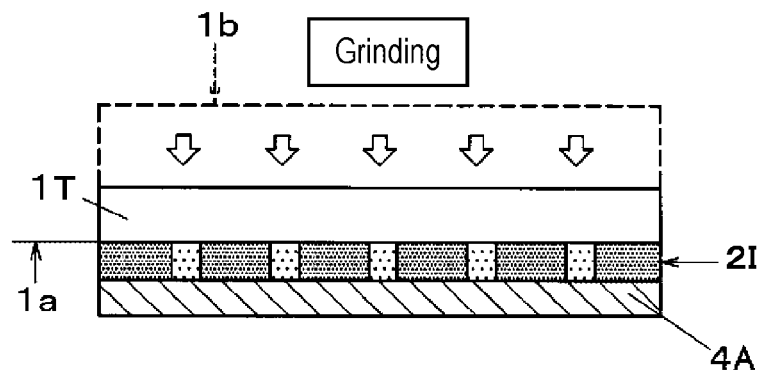
FIG. 7C is a process explanatory view illustrating the second example of the method of fabricating the element chips according to the embodiment of the present disclosure.
Figure 7D:
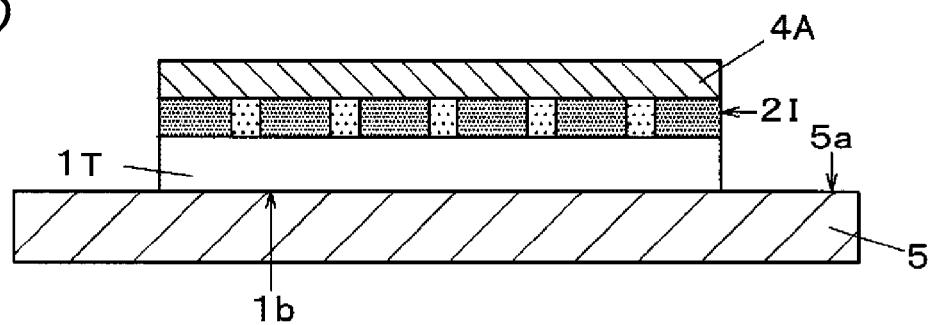
FIG. 7D is a process explanatory view illustrating the second example of the method of fabricating the element chips according to the embodiment of the present disclosure.
Figure 8A:
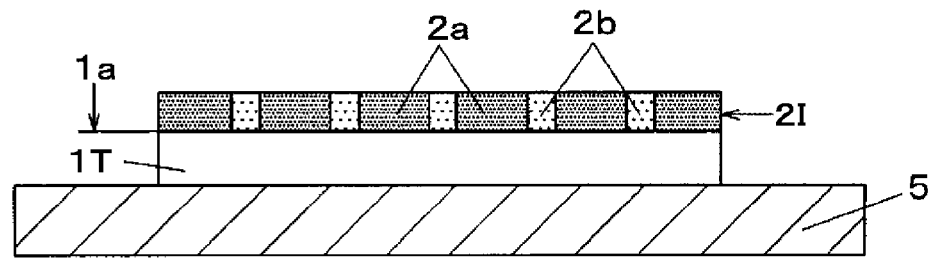
FIG. 8A is a process explanatory view illustrating the second example of the method of fabricating the element chips according to the embodiment of the present disclosure.

Second surface 1b opposite to first surface 1a is mechanically ground, and thereby substrate 1 becomes substrate 1T thinned to have a predetermined thickness (grinding process), as illustrated in FIG. 7C. Thereby, substrate 1T enters a state where protection sheet 4 is further pasted to a lower surface of protection film 2I formed on first surface 1a. Thereafter, second surface 1b side of substrate 1T in the aforementioned state is supported by support surface 5a of carrier 5 with adhesiveness, as illustrated in FIG. 7D. In this state, protection sheet 4 is peeled off from protection film 2I, and protection film 2I of first surface 1a is exposed (peeling process), as illustrated in FIG. 8A. Thereby, exposed protection film 2b and unexposed protection film 2a are exposed in protection film 2I.

A dicing tape supported by a dicing frame, or a support substrate having an adhesive layer on support surface 5a can be exemplified as carrier 5. In addition, a carrier of an electrostatic chucking type may be used as carrier 5. In a case of the carrier of an electrostatic chucking type, chucking force based on electrostatic force between substrate 1 and the carrier is generated by applying a voltage to an electrode embedded in the carrier, and thus, even though a support surface does not have adhesiveness, substrate 1 can be supported on the support surface. Since the carrier of an electrostatic chucking type can maintain chucking force even at a high temperature, the carrier can support substrate 1, even if thermal processing is performed with respect to substrate 1 supported by the carrier at a relatively high temperature at which, for example, an adhesive with resin properties is deteriorated.

Figure 8B:
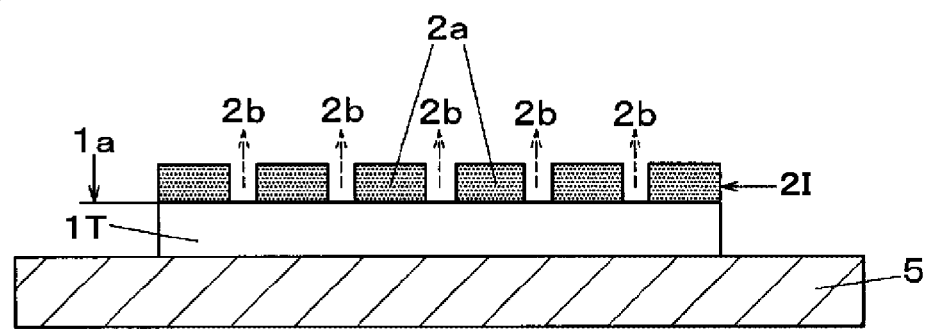
FIG. 8B is a process explanatory view illustrating the second example of the method of fabricating the element chips according to the embodiment of the present disclosure.

Subsequently, carrier 5 supporting substrate 1T on which protection film 2I is formed is moved to a developing process. Here, after the peeling process, protection film 2I comes into contact with a development solution selectively dissolving any one of exposed protection film 2b and unexposed protection film 2a, and thereby protection film 2I is patterned (developing process). Thereby, exposed protection film 2b is dissolved by the development solution and removed, only unexposed protection film 2a remains on first surface 1a of substrate 1T, and thereby the same pattern as photomask 3 is formed, as illustrated in FIG. 8B. It is preferable that thermal processing is performed for patterned substrate 1T and thereby plasma resistance of protection film 2a increases before substrate 1T is moved to an etching process.

Figure 8C:
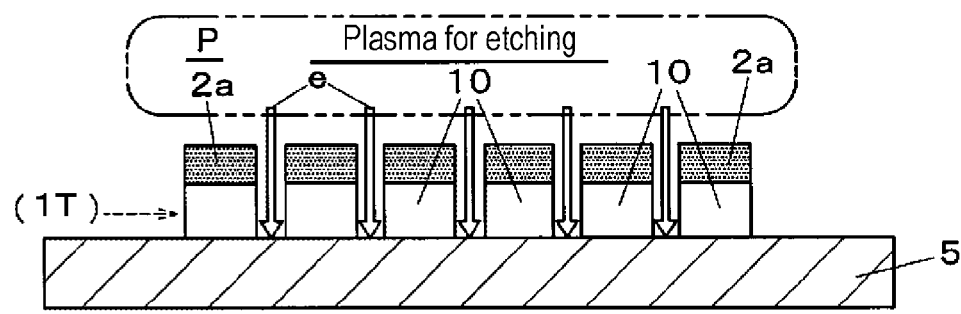
FIG. 8C is a process explanatory view illustrating the second example of the method of fabricating the element chips according to the embodiment of the present disclosure.

Subsequently, carrier 5 supporting patterned substrate 1T is moved to an etching process. Here, an example in which plasma etching performed by plasma processing is used as an etching method is illustrated. That is, carrier 5 supporting substrate 1T is mounted in a plasma etching device (not illustrated), the device generates plasma P for etching, and thereby, the region in which protection film 2a does not remain in substrate 1T is removed by a plasma etching action (arrow e), as illustrated in FIG. 8C. That is, substrate 1T is etched by using patterned unexposed protection film 2a as a mask (etching process). Substrate 1T is divided by the etching, and thereby substrate 1T is diced into a plurality of element chips 10 (dicing process). There is a case where protection film 2a used as a mask remains on a surface of diced element chips 10. In this case, remaining protection film 2a may be removed by ashing which uses plasma.

In the second example, light-transmissive protection sheet 4A is used, and thus, processes from the preparing process to the developing process prevent additional exposure of the resist, and are performed in a yellow room in principle. However, the processes may be performed in a place other than the yellow room according to a resist material which is used or required patterning accuracy.

Figure 9A:
FIG. 9A is a process explanatory view illustrating a third example of the method of fabricating the element chips according to the embodiment of the present disclosure.
Figure 9B:
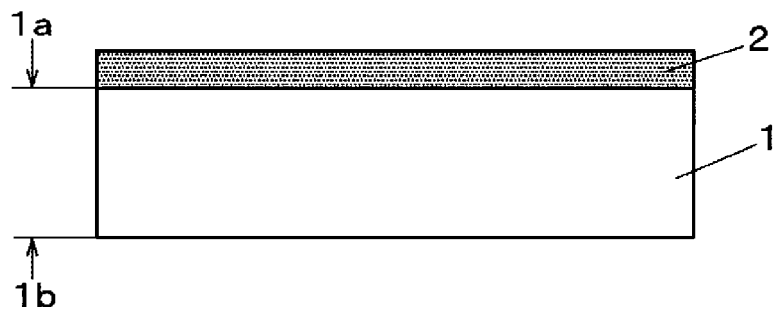
FIG. 9B is a process explanatory view illustrating the third example of the method of fabricating the element chips according to the embodiment of the present disclosure.
Figure 9C:
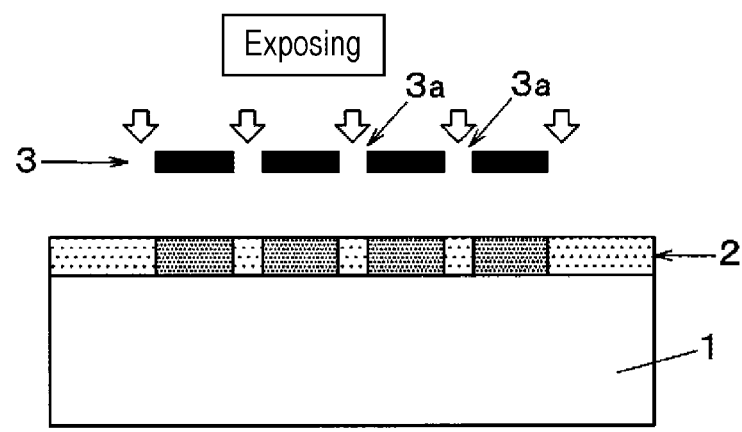
FIG. 9C is a process explanatory view illustrating the third example of the method of fabricating the element chips according to the embodiment of the present disclosure.

Subsequently, a third example of a method of forming element chips according to the present embodiment will be described with reference to FIG. 9A to FIG. 11C. In FIGS. 9A to 9C, substrate 1 illustrated in FIG. 9A has a wafer shape having first surface 1a on which a plurality of element chips (refer to element chips 10 illustrated in FIG. 12C) are formed. As illustrated in FIG. 9B, photosensitive protection film 2 is formed on first surface 1a of substrate 1 by applying a resist. Thereby, substrate 1 having first surface 1a on which photosensitive protection film 2 is formed is prepared (preparing process). Second surface 1b opposite to first surface 1a is a grinding surface which is a grinding target in a post-process. Photosensitive protection film 2 may be formed on first surface 1a of substrate 1 by pasting a dry film resist formed by thinning a photosensitive material in a film shape, on first surface 1a of substrate 1, instead of coating the first surface with a resist.

Figure 10A:
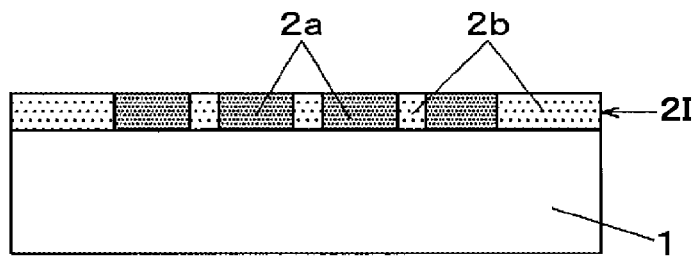
FIG. 10A is a process explanatory view illustrating the third example of the method of fabricating the element chips according to the embodiment of the present disclosure.

Subsequently, substrate 1 is moved to an exposing process, and photomask 3 in which openings 3a are formed in a predetermined pattern is set over an upper surface of protection film 2, as illustrated in FIG. 9C. In this state, photomask 3 is irradiated with light with a predetermined wavelength, and thereby only regions of protection film 2 corresponding to openings 3a of photomask 3 are exposed. That is, at least a part of protection film 2 is exposed in the exposing process. Thereby, exposure-ended protection film 2I is formed in which exposed protection film 2b and unexposed protection film 2a are distributed in correspondence with the pattern of openings 3a of photomask 3, as illustrated in FIG. 10A. General exposure means, such as contact exposure, projection exposure of equal magnification, reduction projection type exposure which uses a stepper, or direct drawing which uses a laser or an electronic beam can be used as exposure means used in the exposing process.

Figure 10B:
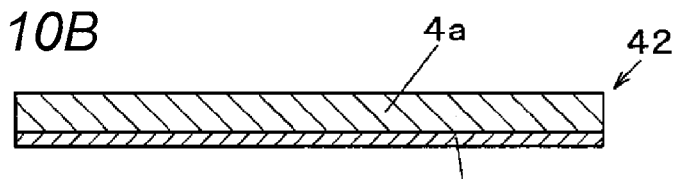
FIG. 10B is a process explanatory view illustrating the third example of the method of fabricating the element chips according to the embodiment of the present disclosure.
Figure 10C:
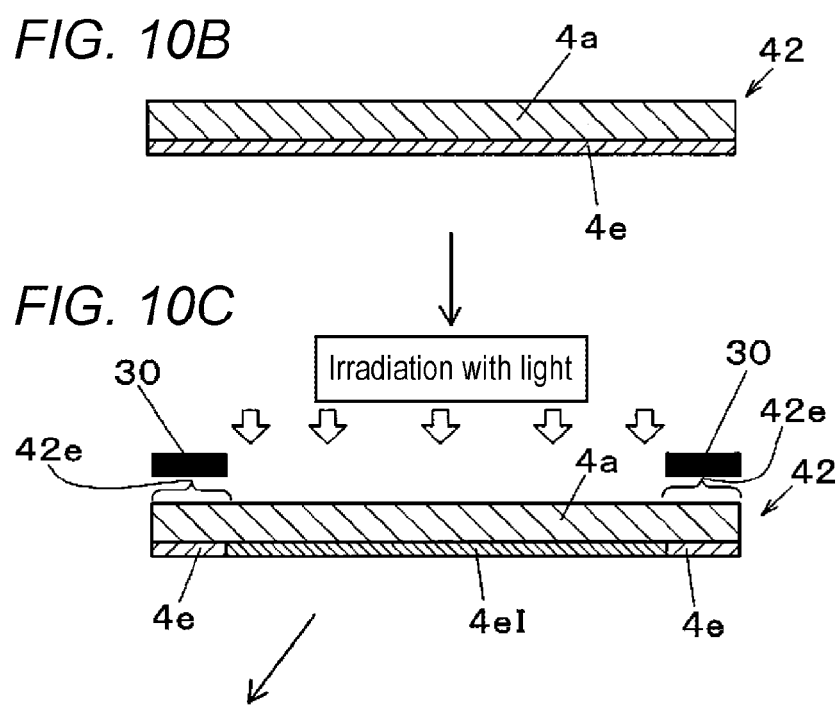
FIG. 10C is a process explanatory view illustrating the third example of the method of fabricating the element chips according to the embodiment of the present disclosure.
Figure 10D:
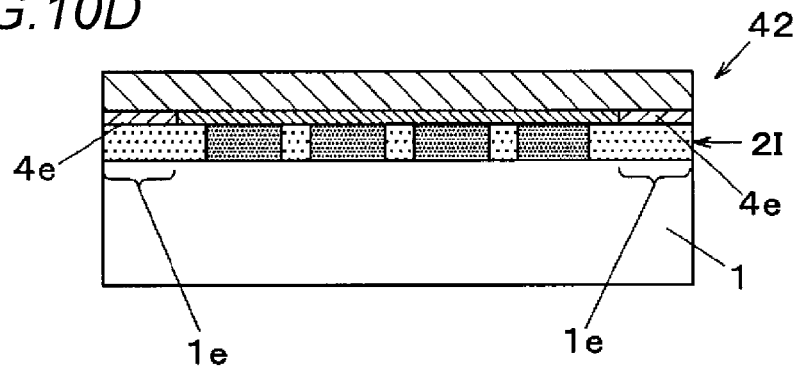
FIG. 10D is a process explanatory view illustrating the third example of the method of fabricating the element chips according to the embodiment of the present disclosure.

Subsequently, protection sheet 42 (refer to FIG. 5B) is pasted to protection film 2I of first surface 1a of substrate 1 (pasting process), as illustrated in FIG. 10A and FIG. 10D after the exposing process. When protection sheet 42 is pasted, processing illustrated in FIG. 10B and FIG. 10C is performed in advance with respect to protection sheet 42. That is, adhesive layer 4e with properties cured by applying light such as UV light onto a lower surface of base material 4a is formed on protection sheet 42, as illustrated in FIG. 10B. Before protection film 2I is pasted, processing of partially curing adhesive layer 4e is performed.

That is, in a state where shielding mask 30 of a shape covering only outer edge portion 42e of an upper surface of protection sheet 42 thereby shielding the outer edge portion is set on the upper surface of protection sheet 42, protection sheet 42 is irradiated with light with a wavelength curing adhesive layer 4e, such as UV light, as illustrated in FIG. 10C. Thereby, only a region corresponding to outer edge portion 42e covered with shielding mask 30 becomes uncured adhesive layer 4e, and a region which is not covered with shielding mask 30 and is irradiated with light becomes cured adhesive layer 4eI which is obtained by photo-curing adhesive layer 4e, in adhesive layer 4e provided on the lower surface of protection sheet 42.

Figure 11A:
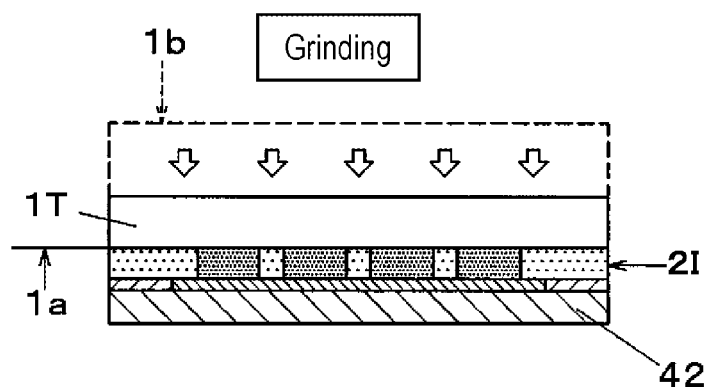
FIG. 11A is a process explanatory view illustrating the third example of the method of fabricating the element chips according to the embodiment of the present disclosure.

In this way, protection sheet 42 to which processing of partially photo-curing adhesive layer 4e is performed is pasted to protection film 2I, as illustrated in FIG. 10D. At this time, protection sheet 42 is fixed to protection film 2I by adhesive force of uncured adhesive layer 4e existing in outer edge portion 42e. After the pasting process, second surface 1b opposite to first surface 1a is mechanically ground, and thereby substrate 1 becomes substrate 1T thinned to have a predetermined thickness (grinding process), as illustrated in FIG. 11A. Thereby, substrate 1T enters a state where protection sheet 42 is further pasted to a lower surface of protection film 2I formed on first surface 1a.

In the grinding process, a periphery of protection sheet 42 is fixed to protection film 2I by adhesive layer 4e existing in outer edge portion 42e, and thus, it is possible to prevent moisture from invading adhesion interface between protection sheet 42 and protection film 2I during grinding. It is possible for adhesive layer 4e formed on protection sheet 42 and cured adhesive layer 4eI to receive pressure from a polishing pad used for grinding as a surface load, and to prevent protection film 2I from being damaged due to intensive acting of a load. Even in a case where general protection sheet 4 including a normal adhesive layer without photo-curable adhesive layer 4e is used in the same manner as protection sheet 42, the entire surface of protection sheet 4 comes into surface contact with protection film 2I, and thus, the same effects are obtained.

Figure 11B:
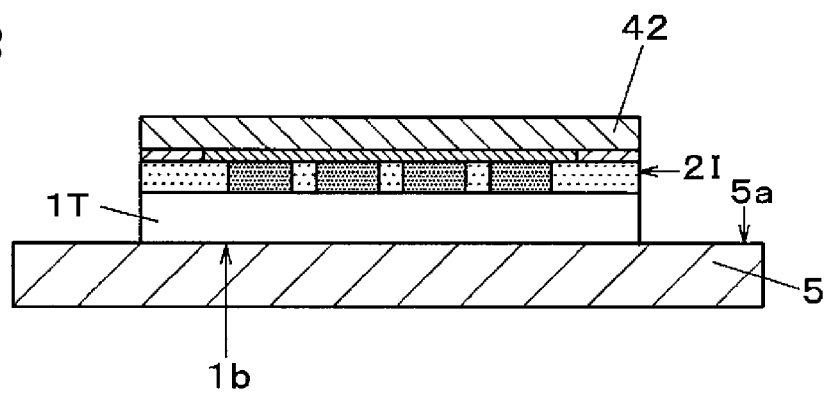
FIG. 11B is a process explanatory view illustrating the third example of the method of fabricating the element chips according to the embodiment of the present disclosure.
Figure 11C:
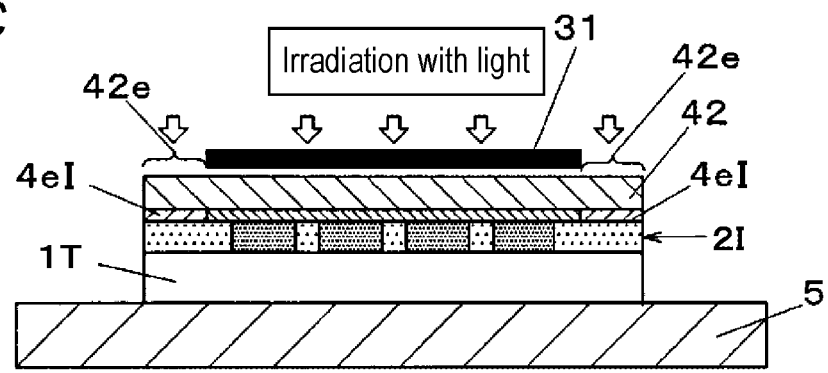
FIG. 11C is a process explanatory view illustrating the third example of the method of fabricating the element chips according to the embodiment of the present disclosure.

Thereafter, second surface 1b side of substrate 1T in the aforementioned state is supported by support surface 5a of carrier 5 with adhesiveness, as illustrated in FIG. 11B. Here, a dicing tape supported by a dicing frame, or a support substrate having an adhesive layer on support surface 5a can be exemplified as carrier 5. In this state, the substrate is moved to a peeling process in which protection sheet 42 is peeled off from protection film 2I. In the peeling process, in a state where shielding mask 31 covering only a region except for outer edge portion 42e to shield light is set, protection sheet 42 is irradiated with light with a wavelength curing adhesive layer 4e, such as UV light, in an upper surface of protection sheet 42, as illustrated in FIG. 11C. Thereby, adhesive layer 4e of a region corresponding to outer edge portion 42e which is not covered with shielding mask 31 is photo-cured to become cured adhesive layer 4eI, in adhesive layer 4e provided on the lower surface of protection sheet 42, and adhesive force decreases. Thereby, it is possible to easily peel protection sheet 42 from protection film 2I.

That is, in the third example, protection sheet 42 is pasted to protection film 2I of outer edge portion 1e of substrate 1 by adhesive layer 4e, using protection sheet 42 including photo-curable adhesive layer 4e as a protection sheet protecting protection film 2I when substrate 1 is ground, in a pasting process. In the aforementioned peeling process, outer edge portion 42e corresponding to outer edge portion 1e is irradiated with light with a wavelength which cures adhesive layer 4e, and thereby adhesive force of adhesive layer 4e of protection sheet 42 decreases.

By using such a method, protection sheet 42 adheres to substrate 1 by only outer edge portion 42e corresponding to outer edge portion 1e of substrate 1, even in a case where protection sheet 42 is peeled off by irradiating with light. Accordingly, it is possible to peel off protection sheet 42 only by applying light to outer edge portion 1e of substrate 1. At this time, a place other than outer edge portion 1e of substrate 1 is not irradiated with light, and thus, there is no failure due to additional exposure of protection film 2I previously exposed.

Figure 12A:
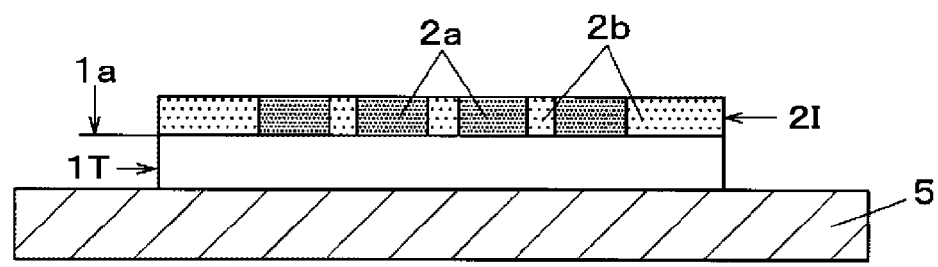
FIG. 12A is a process explanatory view illustrating the third example of the method of fabricating the element chips according to the embodiment of the present disclosure.
Figure 12B:
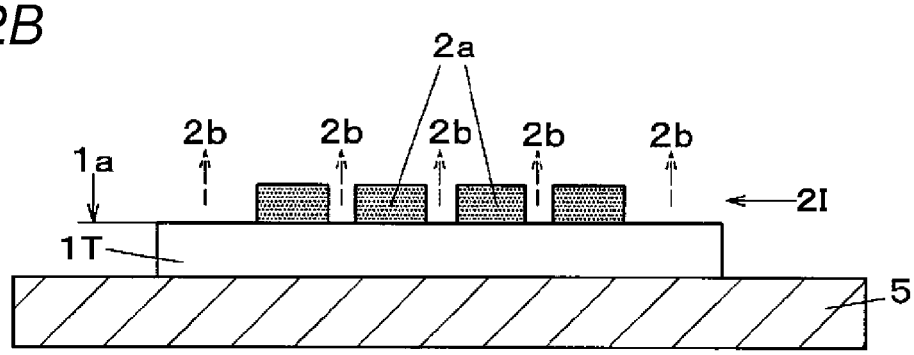
FIG. 12B is a process explanatory view illustrating the third example of the method of fabricating the element chips according to the embodiment of the present disclosure.

By doing so, protection sheet 42 is peeled off from protection film 2I, and thereby exposed protection film 2b and unexposed protection film 2a of protection film 2I are exposed, as illustrated in FIG. 12A. Subsequently, carrier 5 supporting substrate 1T on which protection film 2I is formed is moved to a developing process. Here, after the peeling process, protection film 2I comes into contact with a development solution selectively dissolving any one of exposed protection film 2b and unexposed protection film 2a, and thereby protection film 2I is patterned (developing process). Thereby, exposed protection film 2b is dissolved by the development solution and removed, only unexposed protection film 2a remains on first surface 1a of substrate 1T, and thereby the same pattern as photomask 3 is formed, as illustrated in FIG. 12B. It is preferable that thermal processing is performed for patterned substrate 1T before substrate 1T is moved to an etching process and thereby plasma resistance of protection film 2a increases.

Figure 12C:
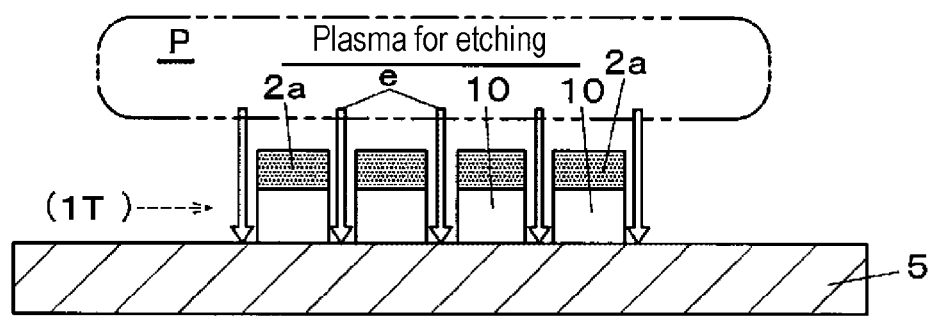
FIG. 12C is a process explanatory view illustrating the third example of the method of fabricating the element chips according to the embodiment of the present disclosure.

Subsequently, carrier 5 supporting patterned substrate 1T is moved to an etching process. Here, an example in which plasma etching performed by plasma processing is used as an etching method is illustrated. That is, carrier 5 supporting substrate 1T is mounted in a plasma etching device (not illustrated), the device generates plasma P for etching, and thereby, the region in which protection film 2a does not remain in substrate 1T is removed by a plasma etching action (arrow e), as illustrated in FIG. 12C.

That is, substrate 1T is etched by using patterned protection film 2a as a mask (etching process). Substrate 1T is divided by the etching, and thereby substrate 1T is diced into a plurality of element chips 10 (dicing process). There is a case where protection film 2a used as a mask remains on a surface of diced element chips 10. In this case, remaining protection film 2a may be removed by ashing which uses plasma.

The first example, the second example, and the third example which are described above, describe a method of fabricating element chips in which diced element chips are fabricated by etching a substrate. As described above, the method of fabricating the element chips includes the preparing process in which substrate 1 having first surface 1a on which photosensitive protection film 2 is formed is prepared, and the exposing process in which at least a part of protection film 2 is exposed after the preparing process. In addition, the method includes the pasting process in which protection sheet 4 is pasted to protection film 2I of first surface 1a after the exposing process (in addition, the pasting process in which protection sheet 4 is pasted to protection film 2 of first surface 1a, and the exposing process in which at least a part of protection film 2 is exposed by transmitting light through protection sheet 4 after the pasting process). In addition, the method includes the grinding process in which substrate 1 is thinned by grinding second surface 1b opposite to first surface 1a, and the peeling process in which protection film 2I of first surface 1a is exposed by peeling protection sheet 4 after the grinding process. In addition, the method includes the developing process in which protection film 2I is patterned by making protection film 2I come into contact with the development solution selectively dissolving any one of the exposed protection film and the unexposed protection film, after the peeling process. In addition, the method is configured to include the dicing process in which substrate 1T is diced into a plurality of element chips 10 by etching substrate 1T by using patterned protection film 2I as a mask.

Among combinations of each process configuring the aforementioned method of fabricating the element chips, the preparing process, the pasting process, the exposing process, the grinding process, the peeling process, and the developing process configure a method of forming a mask pattern in which a mask pattern is formed on a substrate. In the same manner, among combinations of processes configuring the aforementioned method of fabricating the element chips, the preparing process, the pasting process, the exposing process, the grinding process, the peeling process, the developing process, and the etching process in which a substrate is etched by using a patterned protection film as a mask configure a method of processing a substrate in which the substrate is processed by etching.

A process sequence is set to all of the method of fabricating the element chips, the method of forming the mask pattern, and the method of processing the substrate, such that a developing process is performed in which exposure-ended protection film 2I is patterned after the grinding process in which substrate 1 is thinned by grinding second surface 1b opposite to first surface 1a to which photo-sensitive protection film 2 is pasted. Thereby, it is possible to perform grinding for thinning in a state where protection film 2I is stable without being patterned, and to prevent substrate 1 or protection film 2I on which the mask pattern is formed from being damaged at the time of grinding, even in a case where substrate 1 of a thin wafer shape becomes a target.

The method of fabricating the element chips, the method of forming the mask pattern, and the method of processing the substrate according to an exemplary embodiment have effects in which the substrate or the mask pattern of the substrate can be prevented from being damaged even in a case where the substrate of a thin wafer shape becomes a target, and are effective in a field in which the element chips are fabricated by forming a mask pattern in the substrate of a wafer shape, dicing the substrate by etching.

What is claimed is:

1. A method of forming a mask pattern in a substrate, comprising:
    preparing a substrate having a first surface on which a photosensitive protection film is formed and a second surface opposite to the first surface;
    exposing at least a part of the photosensitive protection film;
    pasting a protection sheet to the photosensitive protection film of the first surface after the exposing;
    grinding the second surface to thin the substrate after the pasting;
    peeling the protection sheet to uncover the photosensitive protection film of the first surface after the grinding; and
    patterning the photosensitive protection film by making the photosensitive protection film come into contact with a developing solution which selectively dissolves any one of an exposed protection film and an unexposed protection film after the peeling.

2. The method of forming a mask pattern of claim 1, wherein the protection sheet includes a transmission preventing layer which prevents transmission of light which exposes the photosensitive protection film.

3. The method of forming a mask pattern of claim 2, wherein the transmission preventing layer is formed of a metal.

4. The method of forming a mask pattern of claim 1,
    wherein a protection sheet with thermal peeling properties is used as the protection sheet, and
    wherein adhesive force of the protection sheet is decreased by heating the substrate during the peeling.

5. The method of forming a mask pattern of claim 1,
wherein a protection sheet including a photo-curable adhesive layer is used as the protection sheet,
wherein the protection sheet is pasted to the photosensitive protection film of an outer edge portion of the substrate by the photo-curable adhesive layer during the pasting, and
wherein adhesive force of the protection sheet is decreased by applying light with a wavelength which cures the photo-curable adhesive layer to the outer edge portion during the peeling.

6. A method of fabricating element chips by dicing a substrate by etching, comprising:
preparing a substrate having a first surface on which a photosensitive protection film is formed and a second surface opposite to the first surface;
exposing at least a part of the photosensitive protection film;
pasting a protection sheet to the photosensitive protection film of the first surface after the exposing;
grinding the second surface to thin the substrate after the pasting;
peeling the protection sheet to uncover the photosensitive protection film of the first surface after the grinding;
patterning the photosensitive protection film by making the photosensitive protection film come into contact with a developing solution which selectively dissolves any one of an exposed protection film and an unexposed protection film after the peeling; and
dicing the substrate into a plurality of element chips by etching the substrate, using the patterned photosensitive protection film as a mask.

7. The method of fabricating element chips of claim 6, wherein the protection sheet includes a transmission preventing layer which suppresses transmission of light which exposes the photosensitive protection film.

8. The method of fabricating element chips of claim 7, wherein the transmission preventing layer is formed of a metal.

9. The method of fabricating element chips of claim 6,
wherein a protection sheet with thermal peeling properties is used as the protection sheet, and
wherein adhesive force of the protection sheet is decreased by heating the substrate during the peeling.

10. The method of fabricating element chips of claim 6,
wherein a protection sheet including a photo-curable adhesive layer is used as the protection sheet,
wherein the protection sheet is pasted to the photosensitive protection film of an outer edge portion of the substrate by the photo-curable adhesive layer during the pasting, and
wherein adhesive force of the protection sheet is decreased by applying light with a wavelength which cures the photo-curable adhesive layer to the outer edge portion during the peeling.

* * * * *